United States Patent
Beraud-Sudreau et al.

(10) Patent No.: US 12,316,337 B2
(45) Date of Patent: May 27, 2025

(54) METHOD FOR SYNCHRONIZING ANALOGUE-DIGITAL OR DIGITAL-ANALOGUE CONVERTERS, AND CORRESPONDING SYSTEM

(71) Applicant: TELEDYNE E2V SEMICONDUCTORS SAS, Saint Egreve (FR)

(72) Inventors: Quentin Beraud-Sudreau, Rives sur Fure (FR); Jérôme Ligozat, Grenoble (FR); Marc Stackler, Hong Kong (CN); Rémi Laube, Veurey-Voroize (FR)

(73) Assignee: TELEDYNE E2V SEMICONDUCTORS SAS, Saint Egreve (FR)

( * ) Notice: Subject to any disclaimer, the term of this patent is extended or adjusted under 35 U.S.C. 154(b) by 227 days.

(21) Appl. No.: 18/009,123

(22) PCT Filed: Jun. 2, 2021

(86) PCT No.: PCT/EP2021/064823
§ 371 (c)(1),
(2) Date: Dec. 8, 2022

(87) PCT Pub. No.: WO2021/249848
PCT Pub. Date: Dec. 16, 2021

(65) Prior Publication Data
US 2023/0238975 A1 Jul. 27, 2023

(30) Foreign Application Priority Data
Jun. 9, 2020 (FR) .................. FR2005986

(51) Int. Cl.
*H03M 1/06* (2006.01)

(52) U.S. Cl.
CPC ....... *H03M 1/0624* (2013.01); *H03M 1/0607* (2013.01)

(58) Field of Classification Search
CPC .................. H03M 1/0614; H03M 1/0607
(Continued)

(56) References Cited

U.S. PATENT DOCUMENTS

| | | | |
|---|---|---|---|
| 8,659,453 B1 * | 2/2014 | Low | H03M 1/0658 341/110 |
| 10,666,286 B1 * | 5/2020 | Cattivelli | H03M 3/454 |

(Continued)

FOREIGN PATENT DOCUMENTS

| | | |
|---|---|---|
| EP | 2658129 A2 | 10/2013 |
| EP | 3375092 A1 | 9/2018 |

OTHER PUBLICATIONS

Marc Stackler et al., "A Novel Method to Synchronize High-Speed Data Converters," 2016 IEEE Radar Conference (RadarConf), May 2, 2016, pp. 1-5.
(Continued)

*Primary Examiner* — Peguy Jean Pierre
(74) *Attorney, Agent, or Firm* — Pilloff Passino & Cosenza LLP; Rachel K. Pilloff; Sean A. Passino

(57) ABSTRACT

The invention relates to a method for synchronizing a plurality of analogue-digital or digital-analogue converters (CONV_k), the converters (CONV_k) all being connected to a control unit (UC), and to a clock (CLK) that has a predefined clock period ($T_{clk}$), the converters being also chained step-by-step so as to form a chain of converters, each converter (CONV_k) generating an internal synchronization signal (internal_sync_k) configured to supply a time reference on the transmission of data by the converter (CONV_k).
The method allows the synchronization of the converters to be guaranteed using a process of learning and of configu-
(Continued)

ration of the converters. The method allows any line distance constraint on the synchronization signal to be overcome.

10 Claims, 5 Drawing Sheets

(58) Field of Classification Search
USPC .............................. 341/118, 120, 144, 155
See application file for complete search history.

(56) References Cited

U.S. PATENT DOCUMENTS

| | | | |
|---|---|---|---|
| 11,646,666 B2 * | 5/2023 | Bayer | H03K 5/24 323/271 |
| 2007/0028024 A1 * | 2/2007 | Kottschlag | G06F 13/426 710/305 |
| 2017/0093417 A1 * | 3/2017 | Iwashita | G06F 13/4247 |
| 2018/0323794 A1 | 11/2018 | Bouin et al. | |
| 2019/0360911 A1 | 11/2019 | Loinaz | |

OTHER PUBLICATIONS

Felipe Torres González et al., "Scalability Analysis of White-Rabbit Technology for Cascade-Chain Networks," 2016 IEEE International Symposium on Precision Clock Synchronization for Measurement, Control, and Communications (ISPCS), Sep. 4, 2016, pp. 1-6.
International Search Report and Written Opinion for PCT/EP2021/064823, mailed Sep. 21, 2021.

* cited by examiner

METHOD FOR SYNCHRONIZING ANALOGUE-DIGITAL OR DIGITAL-ANALOGUE CONVERTERS, AND CORRESPONDING SYSTEM

The invention relates to a method for synchronizing analogue-digital or digital-analogue converters. The invention relates also to a system for synchronizing analogue-digital or digital-analogue converters.

Some applications that use multiple analogue-digital converters or multiple digital-analogue converters require the ability to synchronize these converters with one another. Synchronization is understood to mean a deterministic alignment of the data to be converted or of the converted data.

That can affect in particular the I/Q modulation applications which work with a converter which processes the signals in phase (I), and a converter which processes the signals in phase quadrature (Q). For the modulation to be effective, it is necessary for the signals to be in quadrature, at the risk of degrading the performance of the modulator.

Other applications require the use of several tens of synchronous converters. That is notably the case with antenna arrays, dedicated for example to beam-forming. Beam-forming comprises multiple channels, each equipped with a digital-analogue converter. There again, it is necessary for the different converters to have a controlled and deterministic alignment, even at high working frequencies.

In the case of an analogue-digital converter, the digital words, resulting from the conversion, must be aligned to correspond to one another for a subsequent digital processing. In the case of a digital-analogue converter, the digital signals at the input must also be aligned and be processed at the same moment by the converters.

In the case of an analogue-digital converter, the data can be realigned in the control unit (generally FPGA or ASIC). On the other hand, in the case of a digital-analogue converter, the only way to realign the signals at the output is to use an analogue delay; this type of component is extremely energy-intensive and difficult to adjust. The issue of the synchronization of the converters is primarily specific to the digital-analogue converters, although the invention applies equally to the synchronization of analogue-digital converters.

These days, there are various solutions available for synchronizing multiple converters with one another.

One solution consists, for the interfaces of LVDS ("Low Voltage Differential Signalling" or "Low Voltage Differential Transmission": connection interface between the converters and the FPGA/ASIC), in adjusting the length of all the electrical paths in order to guarantee the synchronization of all the converters in the same clock period. The propagation times of the signals on the copper tracks of an electronic circuit board is of the order of a few ps/mm, so it is then necessary to adjust the length of all the electrical paths in order to guarantee the synchronization of all the converters in the same clock period. On certain applications, in particular beyond a hundred or so megahertz, it is difficult, even impossible, to act on the physical distance separating the components. This solution is thus complicated to implement and implies either significant constraints on the lengths of the tracks and/or that impact the sampling clock, which degrades the performance of the converters.

For the serial interfaces, for which the data are sent without any mutual phase relationship, a word is defined in the frame, the word is detected, and the frames are aligned with one another. In order to align these frames, a memory of significant size (of the order of 1 kbyte) is necessary, and the expected precision is not obtained. The solutions that consist in adding components on the path of the clock signal are likely to cause the clock signal to fluctuate (jitter phenomenon), which degrades the performance of the clock.

In particular, there are solutions which use subdivisions of the sampling frequency of the converters and a master/slave format to realise these synchronizations. Such is the case notably with the JESD204B serial interface, described notably in the document "JESD204B Survival Guide" (available under the link https://www.analog.com/media/en/technical-documentation/technical-articles/JESD204B-Survival-Guide.pdf, pages 21 and 22), which ensures the interoperability of the FPGAs with the analogue/digital converters and with the digital/analogue converters. This solution is based on the sending to the converters of a very low-frequency division of the clock to the converters and to the control unit. Active components ("Fanout Buffer" and "AD9525" clock generator in the abovementioned document), added on the path of the clock signal, are required for this interface. During the synchronization learning phase, it has been found that the temperature withstand strength is not good, because of the presence of the active components. The temperature variations therefore render the system much more difficult to adjust, in particular when a fine adjustment is required.

It is also known practice, according to the document EP 3 375 092 A1, to synchronize data converters step-by-step. For that, the converters are configured in at least one serial chain. The in-phase distribution of a synchronization signal to all the converters is replaced by the transmission of the synchronization signal from one converter to another to reach all the converters of a chain step-by-step. During a learning step, the propagation delays (set by the physical characteristics of the propagation path) of a signal from one point to another are thus determined for each converter.

According to the document EP 3 375 092 A1, during the learning phase, the user must observe, for example by an oscilloscope, the synchronization signal at the output of the consecutive converters, which corresponds to the propagation delay between the output of one converter and the input of the next converter. This determination is therefore made "manually" by the user: it is not made by a process managed by the control unit. Although the learning phase takes place only once, the fact of having to manage it manually, with measurements made by the user, represents a waste of time.

The invention therefore aims to provide a method for synchronizing analogue-digital or digital-analogue converters, and one which can be performed automatically, without the intervention of the user.

One subject of the invention is therefore a method for synchronizing a plurality of analogue-digital or digital-analogue converters, the converters all being connected to a control unit, and to a clock that has a predefined clock period, the converters being also chained step-by-step so as to form a chain of converters, each converter generating an internal synchronization signal configured to supply a time reference on the transmission of data by the converter, the method comprising, for each converter, the following steps:
  a) reception of a synchronization signal transmitted by the control unit for the first converter of the chain, or transmitted by the preceding converter for the other converters of the chain, and transmission of the synchronization signal to a next converter in the form of a so-called output internal signal, or to the control unit for the last converter of the chain;
  b) reception, by the next converter, of the output internal signal, and retransmission to the converter of the output internal signal in the form of a so-called check internal signal, except for the last converter of the chain;

c) reception of the check internal signal by the converter, except for the last converter of the chain;

d) determination of a latency between the converter and the next converter, except for the last converter of the chain, by counting, on the same active clock edge, of the clock periods between the transmission of the output internal signal and the reception of the check internal signal;

e) computation of an internal offset to be applied to the internal synchronization signal of each converter, the internal offset being determined as a function of at least a part of the determined latencies.

Advantageously, the internal offset $\Delta_{CONV\_k}$ of the converter of rank k (k=1, . . . , N−1), is computed by the following relationship, starting from k=N−1:

$$\Delta_{CONV\_k}=\frac{1}{2}*lat_{CONV\_k+1}+\Delta_{CONV\_k+1}$$

in which $lat_{CONV\_k->CONV\_k+1}$ corresponds to the latency between the converter of rank k and the converter of rank k+1, and in which $\Delta_{CONV\_N}=0$.

Advantageously, each converter detects a metastability of the check internal signal, the metastability corresponding to a simultaneity of the check internal signal with an active clock edge, and transmits to the control unit a signal indicating the metastability or not of the check internal signal, the control unit then transmitting, in cases of metastability of the check internal signal, a new synchronization signal to the first converter of the chain.

Advantageously, the signal indicating the metastability or not of the check internal signal is transmitted to the control unit over a synchronous serial data bus.

Advantageously, each converter transmits the determined internal offset to the control unit.

Advantageously, the determined internal offset is transmitted to the control unit.

Advantageously, the synchronization signal transmitted by the control unit is a pulse of a duration at least equal to one clock period.

The invention relates also to a method for synchronous conversion of a plurality of signals transmitted by a control unit respectively to a plurality of analogue-digital or digital-analogue converters, characterized in that the conversion method first implements the abovementioned synchronization method.

The invention relates also to a system for synchronizing a plurality of analogue-digital or digital-analogue converters, the converters all being connected to a control unit, and to a clock that has a predefined clock period, the converters being also chained step-by-step so as to form a chain of converters, each converter being configured to generate an internal synchronization signal so as to supply a time reference on the transmission of data by the converter, each converter comprising:

a first module configured to receive a synchronization signal transmitted by the control unit for the first converter of the chain, or transmitted by the preceding converter for the other converters of the chain, and to transmit the synchronization signal to a next converter in the form of a so-called output internal signal, or to the control unit for the last converter of the chain;

a second module configured to synchronously receive, except for the last converter of the chain, the output signal retransmitted by the next converter in the form of a so-called check internal signal;

a third module configured to determine a latency between the converter and the next converter, by counting, on the same active clock edge, of the clock periods between the transmission of the output internal signal and the reception of the check internal signal;

the control unit being further configured to compute an internal offset to be applied to the internal synchronization signal of each converter, the internal offset being determined as a function of at least a part of the determined latencies.

Advantageously, the control unit is configured to compute the internal offset $\Delta CONV\_k$ of the converter of rank k (k=1, . . . , N−1), by the following relationship, starting from k=N−1:

$$\Delta CONV\_k=\frac{1}{2}*lat_{CONV\_k->CONV\_K+1}+\Delta_{CONV\_k+1}$$

in which $lat_{CONV\_k->CONV\_k+1}$ corresponds to the latency between the converter of rank k and the converter of rank k+1, and in which $\Delta_{CONV\_N}=0$ Other features, details and advantages of the invention will emerge on reading the description given with reference to the attached drawings given by way of example and which represent, respectively:

FIG. 2 represents a chain of converters and the different signals used in the context of the invention. The two figures will therefore be described simultaneously.

Figure 2:
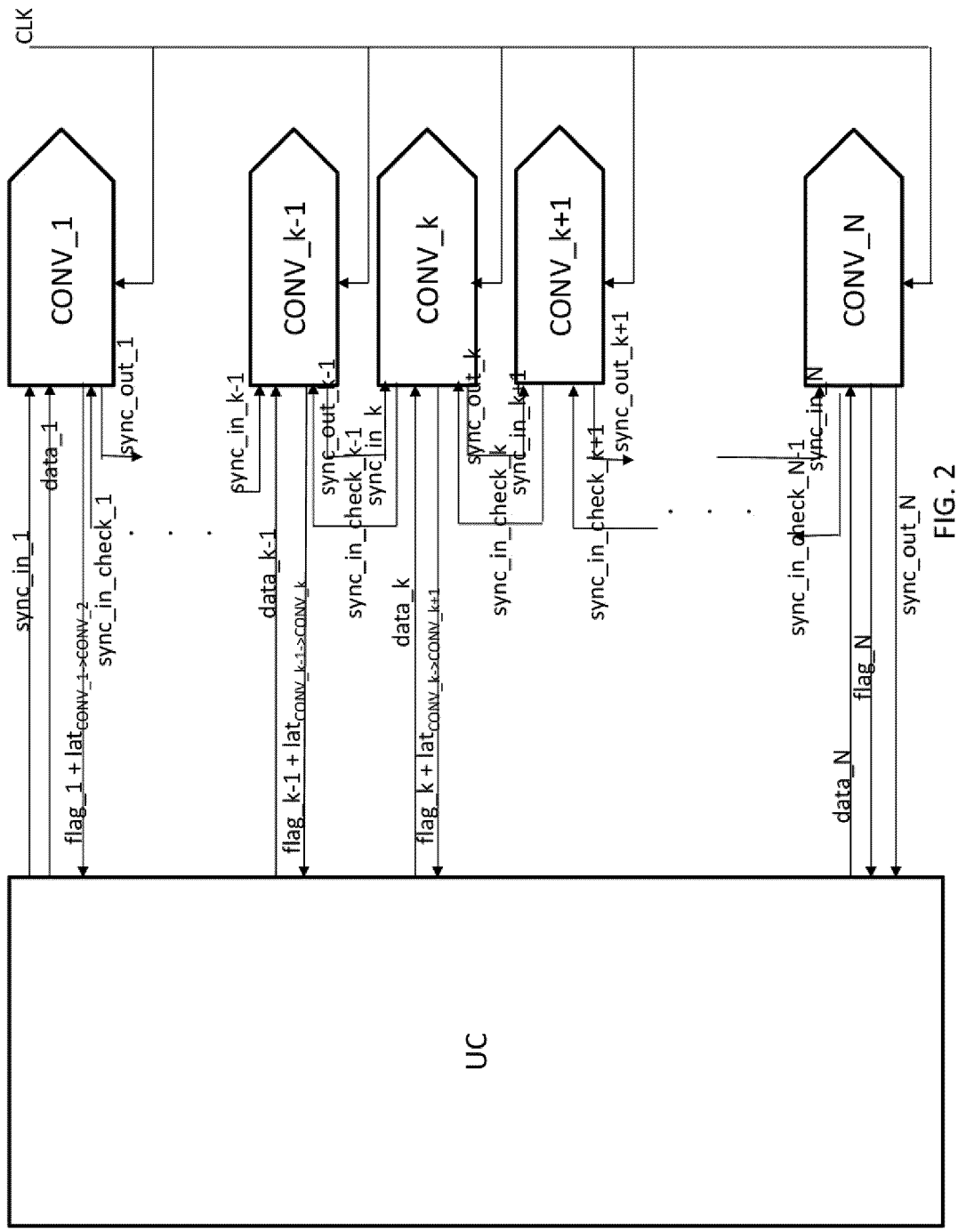
FIG. 2 represents a chain of converters for implementing the synchronization method according to the invention.
Figure 3:
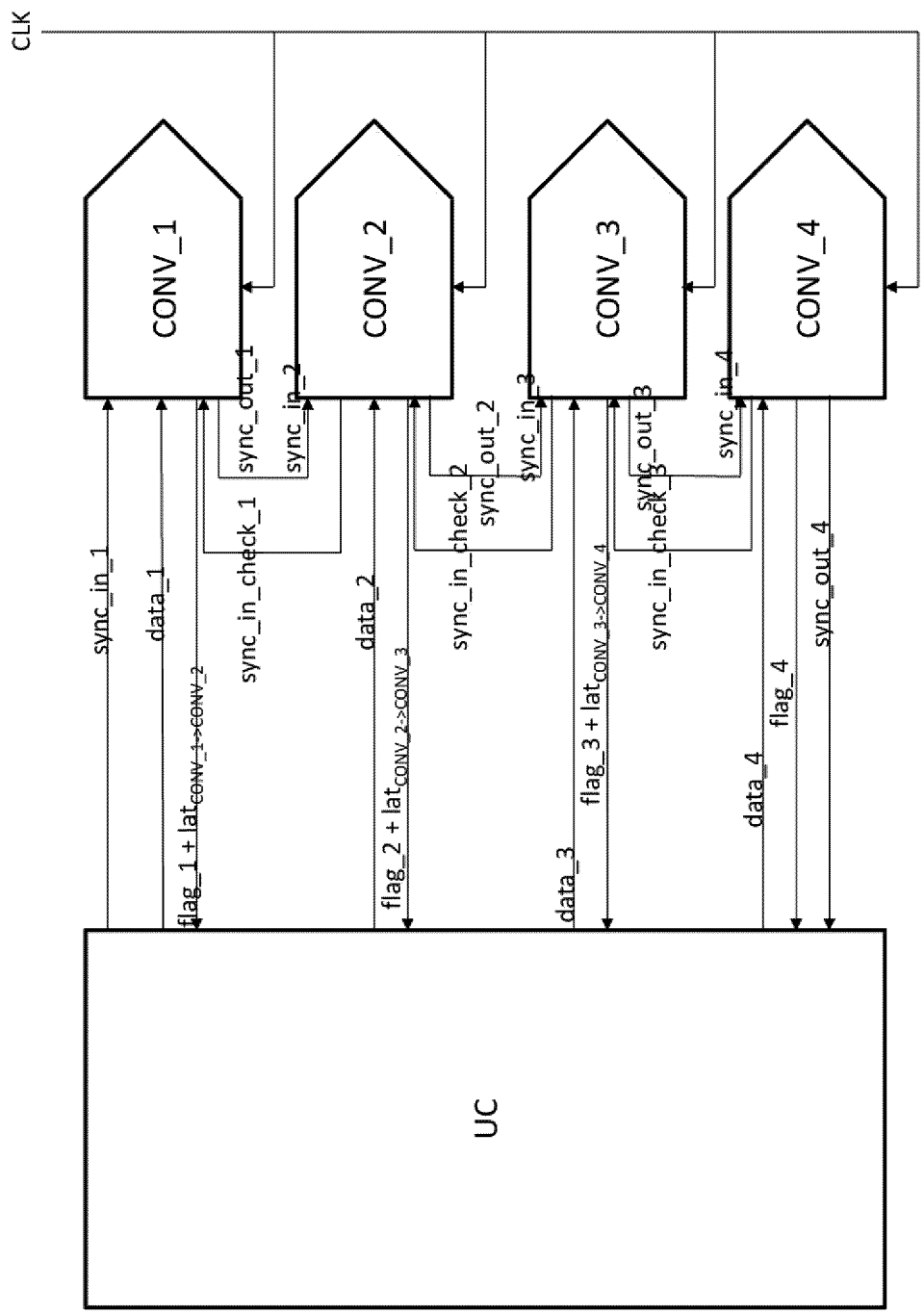
FIG. 3 represents an example of a chain of four converters for implementing the synchronization method according to the invention.

In FIG. 2, N converters are represented (N being an integer greater than or equal to 2), with the following convention: the converter CONV_k corresponds to the converter of rank k of the step-by-step chaining, with k=1, . . . , N. The converter CONV_k, of rank k, receives a signal to be converted data_k transmitted by the control unit UC. Thus, N signals to be converted are transmitted by the control unit UC to the different converters of the chain.

Also, each converter CONV_k, of rank k, is equipped with a terminal for receiving a synchronization signal sync_in_k, transmitted either by the control unit concerning the first converter of the chain CONV_1, or transmitted by the preceding converter CONV_k−1 for the other converters of the chain.

The principle of the step-by-step chaining of the converters is as follows: each converter CONV_k, of rank k, receives the synchronization signal sync_in_k, and transmits the synchronization signal to the next converter CONV_k+1 (of rank k+1) in the form of a so-called output internal signal sync_out_k (step a) of the method, schematically illustrated by FIG. 1). The transmission of the output internal signal is performed synchronously, on an active edge of the clock signal CLK.

The last converter CONV_N of the chain, for its part, transmits the output internal signal sync_out_N to the control unit UC, which informs the control unit UC that the synchronization signal has transited via all the converters of the chain.

Figure 1:
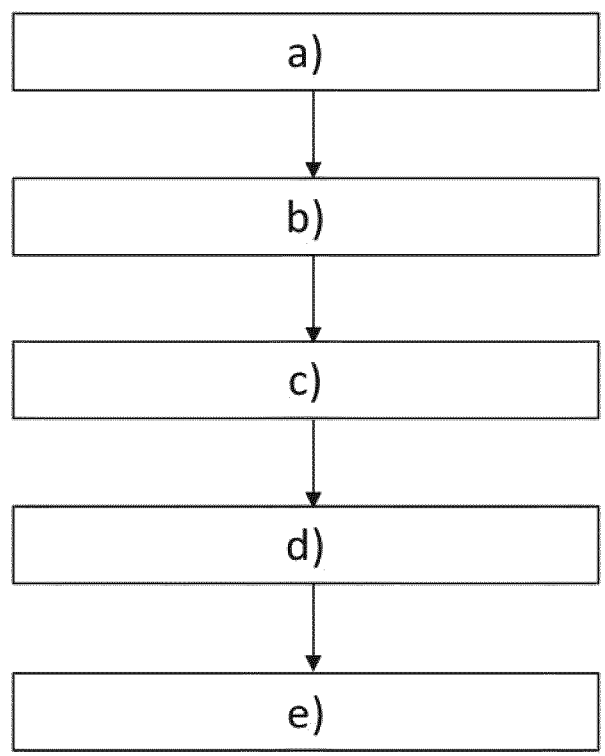
FIG. 1 represents a flow diagram of the synchronization method according to the invention.

The principle of the step-by-step converter chaining is described in document EP 3 375 092 A1 in particular in FIG. 1 of the cited document; the complete operation of the chain of converters is not therefore described in more detail in the present application.

The step-by-step chaining of the converters allows the converters to be well synchronized, at the cost of a step of learning of the synchronization configuration parameters. All the propagation delays of the synchronization signal in the chain are deterministic, the synchronization signals at the output of the converters being all synchronized on an active clock edge CLK.

Moreover, once the next converter CONV_k+1, of rank k+1, has received the output internal signal (sync_out_k transmitted by the next converter CONV_k of rank k), it retransmits in return, to the converter CONV_k of rank k, the output internal signal sync_out_k in the form of a so-called check internal signal sync_in_check_k.

Each converter therefore retransmits the check internal signal sync_in_check_k to its predecessor in the image of the received synchronization signal sync_in_k+1 (step b) of the method according to the invention). The transmission of the check internal signal is performed synchronously, on an active edge of the clock signal CLK. The path taken by the check internal signal sync_in_check_k must therefore be identical (same physical length, but not necessarily the same track) to the path of the synchronization signal sync_in_k+1.

The transmission of the check internal signal and the transmission of the output internal signal take place on a clock edge of the same kind (rising or falling).

In step c) of the method, the converter CONV_k, of rank k, receives the check internal signal sync_in_check_k which had been retransmitted by the next converter CONV_k+1, of rank k+1, in step b).

Each converter then measures (step d)) the latency $\text{lat}_{CONV\text{-}k\text{->}CONV\text{-}k+1}$, between it and the next converter. For that, it counts the clock periods between the transmission of the output internal signal sync_out_k and the reception of the check internal signal sync_in_check_k. The latency thus corresponds to the time that the signal takes to be transmitted to the next converter and to return.

Each converter (except for the last of the chain) transmits the duly determined latency to the control unit UC.

Finally the control unit computes an internal offset $\Delta_{CONV\_k}$ to be applied by each converter to the internal synchronization signal (Internal_Sync), during the synchronization phase. The internal synchronization signal (Internal_Sync) is generated by each converter (CONV_k) during the synchronization phase, in order to supply a time reference on the transmission of data by the converter. In the method according to the invention, the internal offset is determined as a function of at least a part of the determined latencies.

For the converter CONV_N situated at the end of the chain, no latency is measured, because this converter serves as a reference for the internal offset applied to the internal synchronization signal.

Thus, the converters are synchronized during the synchronization phase, although the clock dividers of the different converters are initially in different states. The data to be converted are then automatically aligned by virtue of the serial link protocol which is aligned on the internal synchronization signal.

The measurement of the latency between each converter and the next in the chain can be performed automatically. Likewise, the internal offset, determined as a function of the determined latencies, does not require the intervention of a user.

Thus, this procedure for synchronizing the converters can be performed automatically.

For each converter CONV_k of rank k, a first stage of detection of metastability for the synchronization signal sync_in_k allows, if necessary, the edge (rising or falling) of the sampling clock to be modified. Such a detection stage is described in the document EP 3 375 092 A1 (circuit LS3 in the cited document).

Moreover, each converter CONV_k of rank k comprises a second stage of detection of metastability for the check internal signal sync_in_check_k. If the converter CONV_k of rank detects a metastability of the check internal signal sync_in_check_k, it transmits a signal flag_k to the control unit UC indicating the metastability of the check internal signal sync_in_check_k.

Advantageously, the signal flag_k indicating the metastability or not of the check internal signal sync_in_check_k is transmitted to the control unit UC. A synchronous serial data bus SPI can for example be used to transmit the latency computed by each converter.

Metastability of the synchronization signal sync_in_k or of the check internal signal sync_in_check_k is understood to mean a similarity of the edge of the signal concerned with the clock edge CLK predefined for the detection (rising or falling).

As long as a metastability is present on one of the inputs of the synchronization signal sync_in_k or of the check internal signal sync_in_check_k, the system is non-deterministic and it is not possible to correctly synchronize the different converters, hence the benefit of having an indicator to know it and perform adjustments.

The indicator is advantageously a flag bit, situated in a register of the control unit UC. The flag bit can take one predefined value to indicate that there is no metastability (for example the bit=zero), and another value to indicate that metastability has been detected (for example the bit=1).

In the case where a metastability of the check internal signal sync_in_check_k or of the synchronization signal sync_in_k has been detected, the control unit UC transmits a new synchronization signal sync_in_1 to the first converter of the chain CONV_1. The procedure continues to loop back as long as a metastability is detected in one of the converters of the chain.

Since the propagation delays are deterministic, these adjustments will be set each time the converters are powered up.

According to a particularly advantageous embodiment, the internal offset $\Delta_{CONV\_k\text{ of the converter of rank }k}$ ($k=1, \ldots, N-1$) is computed by the following relationship:

$$\Delta_{CONV\_k} = \tfrac{1}{2} * \text{lat}_{CONV\_k\text{->}CONV\_k+1} + \Delta_{CONV\_k+1}$$

in which $\text{lat}_{CONV\_k\text{->}CONV\_k+1}$ corresponds to the latency between the converter of rank k and the converter of rank k+1, and in which $\Delta_{CONV\text{-}N}=0$.

Figure 4:
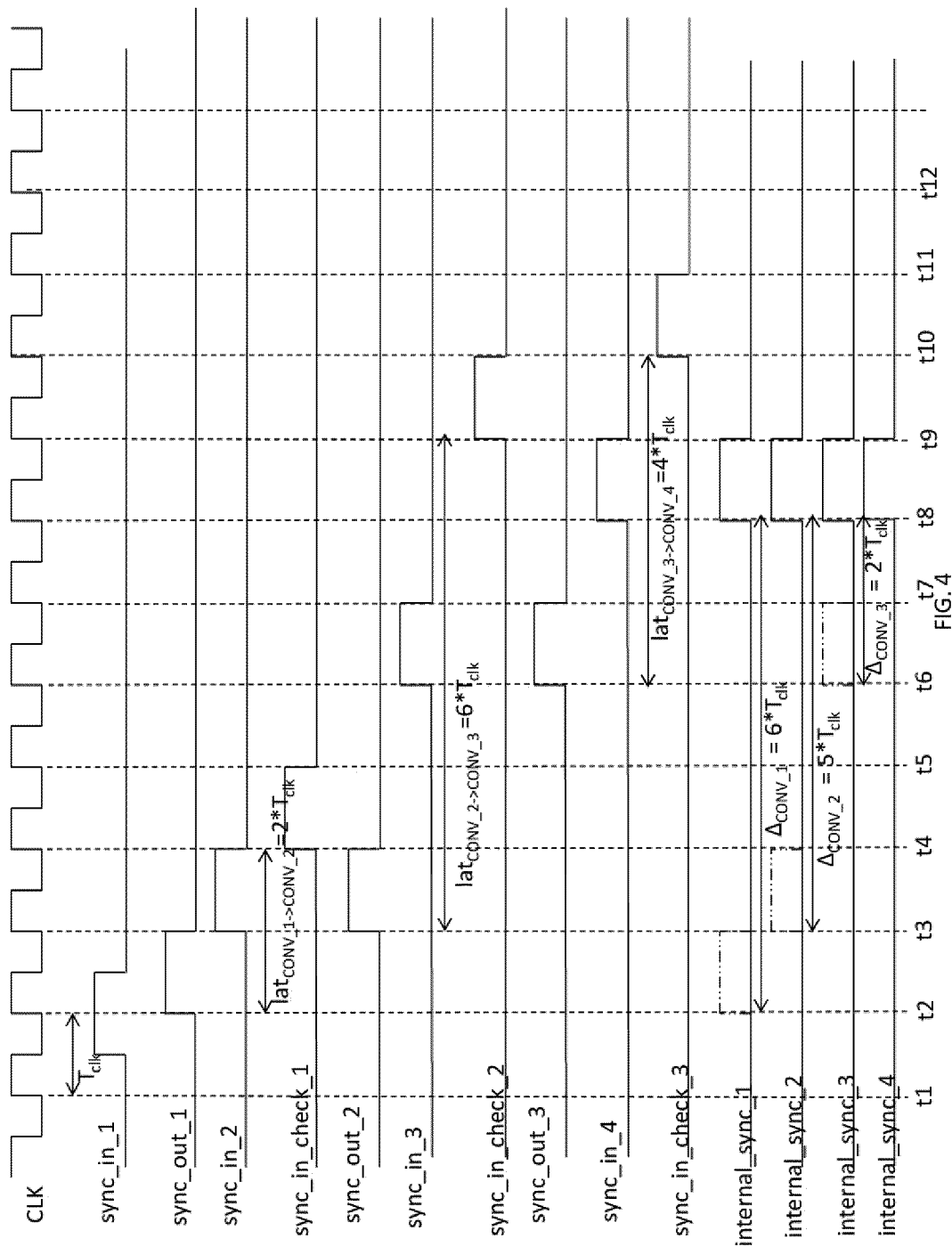
FIG. 4 represents timing diagrams of the different signals used in the example of FIG. 3.

An example of computation of the internal offset is illustrated by the timing diagram of FIG. 4, which should be read in conjunction with the arrangement of four converters (CONV_1, CONV_2, CONV_3 and CONV_4) of FIG. 4.

By convention, in FIG. 4, all the synchronous events are detected on a rising edge of the clock CLK. As a variant, the synchronous events could be detected on a falling edge of the clock CLK.

The synchronization signal sync_in_1, transmitted by the control unit UC, is asynchronous: the reception of the synchronization signal sync_in_1 by the converter of rank 1 CONV_1 occurs outside of a clock edge. If the synchronization signal sync_in_1 was received concomitantly with a clock edge, the first converter CONV_1 would transmit the metastability information to the control unit UC in order to retransmit the synchronization signal sync_in_1.

The converter of rank 1 CONV_1 retransmits the synchronization signal signal sync_in_1 in the form of an output internal signal sync_out_1, on the active edge following the asynchronous reception of the synchronization signal sync_in_1 (instant t2). The converter CONV_2 of rank 2 receives, at the instant t2, the synchronization signal sync_in_2 transmitted by the converter of rank 1 CONV_1. The converter CONV_2 of rank 2 returns to the converter of rank 1 CONV_1 the check internal signal sync_in_check_1, received by the converter of rank 1 CONV_1 at the instant t4.

The converter of rank 1 CONV_1 counts two clock periods between the instants t2 and t4. Thus, the latency $lat_{CONV\_1 \rightarrow CONV\_2}$ between the converter of rank 1 and that of rank 2 is $2*T_{clk}$.

Likewise, it is determined that the latency $lat_{CONV\_2 \rightarrow CONV\_3}$ between the converter of rank 2 and that of rank 3 is $6*T_{clk}$, and that the latency $lat_{CONV\_3 \rightarrow CONV\_4}$ between the converter of rank 3 and that of rank 4 is $4*T_{clk}$.

Thus, the internal offset $\Delta_{CONV\_4}$ of the converter of rank 4 is 0, the internal offset $\Delta_{CONV\_3}$ of the converter of rank 3 is $4*T_{clk}/2=2*T_{clk}$. The internal offset $\Delta_{CONV\_2}$ of the converter of rank 2 is $6*T_{clk}/2+2*T_{clk}=5*T_{clk}$. The internal offset $\Delta_{CONV\_1}$ of the converter of rank 1 is $2*T_{clk}/2+5*T_{clk}=6*T_{clk}$.

The duly determined internal offsets ($\Delta_{CONV\_1}$, $\Delta_{CONV\_2}$ and $\Delta_{CONV\_3}$), applied to each corresponding converter, are then applied to the internal synchronization signal (internal_sync) during the synchronization phase.

Figure 5:
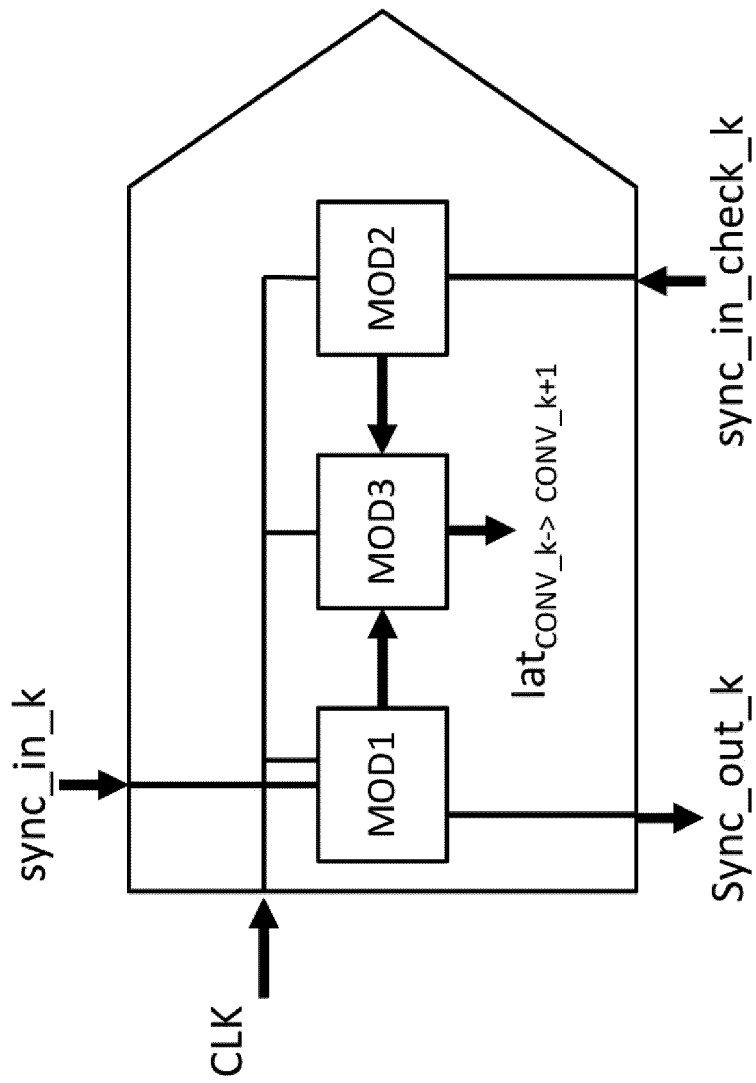
FIG. 5 represents a detail view of each converter, for implementing the synchronization method according to the invention.

FIG. 5 shows the timing diagram of each internal synchronization signal (internal_sync_1, . . . , 4) generated by each converter during the synchronization phase. The dotted-line pulse represents the internal synchronization signal without the internal offsets. By implementing the method according to the invention, the internal synchronization signals (internal_sync_1, . . . , 4) are well aligned with one another for all the converters.

FIG. 5 represents a converter of the synchronization system according to the invention. Each converter comprises a first module MOD1, a second module MOD2 and a third module MOD3.

The three modules are connected to the clock CLK.

The first module MOD1 receives the synchronization signal sync_in_k transmitted by the control unit UC for the first converter CONV_1 of the chain, or transmitted by the preceding converter (CONV_k−1) for the other converters of the chain. It also transmits the output internal signal sync_out_k to the next converter, or to the control unit UC for the last converter of the chain CONV_N.

The second module MOD2 receives the check internal signal sync_in_check_k.

The third module M3 determines the latency $lat_{CONV\_k \rightarrow CONV\_k+1}$ between the converter CONV_k and the next converter CONV_k+1.

Each of the modules (M1, M2, M3) can comprise sequential and combinatorial logic circuits in order to perform the abovementioned functions.

The invention claimed is:

1. A method for synchronizing a plurality of analogue-digital or digital-analogue converters (CONV_k), the converters (CONV_k) all being connected to a control unit (UC), and to a clock (CLK) that has a predefined clock period ($T_{clk}$), the converters being also chained step-by-step so as to form a chain of converters, each converter (CONV_k) generating an internal synchronization signal (internal_sync_k) configured to supply a time reference on the transmission of data by the converter (CONV_k), the method comprising, for each converter (CONV_k), the following steps:
 a) reception of a synchronization signal (sync_in_k) transmitted by the control unit (UC) for the first converter (CONV_1) of the chain, or transmitted by the preceding converter (CONV_k−1) for the other converters of the chain, and transmission of the synchronization signal to a next converter (CONV_k+1) in the form of a so-called output internal signal (sync_out_k), or to the control unit (UC) for the last converter (CONV_N) of the chain;
 b) reception, by the next converter (CONV_k+1), of the output internal signal (sync_out_k), and retransmission to the converter (CONV_k) of the output internal signal (sync_out_k) in the form of a so-called check internal signal (sync_in_check_k), except for the last converter of the chain (CONV_N);
 c) reception of the check internal signal (sync_in_check_k) by the converter (CONV_k), except for the last converter of the chain (CONV_N);
 d) determination of a latency ($lat_{CONV\_k \rightarrow CONV\_k+1}$) between the converter and the next converter, except for the last converter (CONV_N) of the chain, by counting, on the same active clock edge, of the clock periods between the transmission of the output internal signal (sync_out_k) and the reception of the check internal signal (sync_in_check_k);
 e) computation of an internal offset ($\Delta_{CONV\_K}$) to be applied to the internal synchronization signal (internal_sync_k) of each converter (CONV_k), the internal offset being determined as a function of at least a part of the determined latencies.

2. The method according to claim 1, wherein the internal offset $\Delta_{CONV\_k}$ of the converter of rank k (k=1, . . . , N−1), is computed by the following relationship, starting from k=N−1:

$$\Delta_{CONV\_k} = \tfrac{1}{2} * lat_{CONV\_k \rightarrow CONV\_k+1} + \Delta_{CONV\_k+1}$$

in which $lat_{CONV\_k \rightarrow CONV\_k+1}$ corresponds to the latency between the converter of rank k and the converter of rank k+1,
and in which $\Delta_{CONV\_N}=0$.

3. The method according to claim 1, wherein each converter detects a metastability of the check internal signal (sync_in_check_k), the metastability corresponding to a simultaneity of the check internal signal (sync_in_check_k) with an active clock edge, and transmits to the control unit (UC) a signal (flag_k) indicating the metastability or not of the check internal signal (sync_in_check_k), the control unit (UC) then transmitting, in cases of metastability of the check internal signal (sync_in_check_k), a new synchronization signal (sync_in_k) to the first converter of the chain (CONV_1).

4. The method according to claim 3, wherein the signal (flag_k) indicating the metastability or not of the check internal signal (sync_in_check_k) is transmitted to the control unit over a synchronous serial data bus (SPI).

5. The method according to claim 4, wherein the determined internal offset ($\Delta_{CONV\_k}$) is transmitted to the control unit (UC).

6. The method according to claim 1, wherein each converter (CONV_k) transmits the determined internal offset ($\Delta_{CONV\_k}$) to the control unit (UC).

7. The method according to claim 1, wherein the synchronization signal (sync_in_k) transmitted by the control unit is a pulse of a duration at least equal to one clock period.

8. A method for synchronous conversion of a plurality of signals (DATA_k) transmitted by a control unit (UC) respectively to a plurality of analogue-digital or digital-analogue converters (CONV_k) characterized in that the conversion method first implements the synchronization method according to one of the preceding claims.

9. A system for synchronizing a plurality of analogue-digital or digital-analogue converters (CONV_k), the converters (CONV_k) all being connected to a control unit (UC), and to a clock (CLK) that has a predefined clock period ($T_{clk}$), the converters (CONV_k) being also chained step-by-step so as to form a chain of converters, each converter (CONV_k) being configured to generate an internal synchronization signal (internal_sync_k) so as to supply a time reference on the transmission of data by the converter (CONV_k), each converter (CONV_k) comprising:
  a first module (MOD1) configured to receive a synchronization signal (sync_in_k) transmitted by the control unit (UC) for the first converter (CONV_1) of the chain, or transmitted by the preceding converter (CONV_k−1) for the other converters of the chain, and to transmit the synchronization signal to a next converter in the form of a so-called output internal signal (sync_out_k), or to the control unit (UC) for the last converter of the chain (CONV_N);
  a second module (MOD2) configured to synchronously receive, except for the last converter (CONV_N) of the chain, the output signal retransmitted by the next converter in the form of a so-called check internal signal (sync_in_check_k);
  a third module (MOD3) configured to determine a latency ($\text{lat}_{CONV\_k->CONV\_k+1}$) between the converter (CONV_k) and the next converter (CONV_k+1), by counting, on the same active clock edge, of the clock periods between the transmission of the output internal signal (sync_out_k) and the reception of the check internal signal (sync_in_check_k);
  the control unit (UC) being further configured to compute an internal offset ($\Delta_{CONV\_k}$) to be applied to the internal synchronization signal (internal_sync_k) of each converter (CONV_k), the internal offset ($\Delta_{CONV\_k}$) being determined as a function of at least a part of the determined latencies.

10. The system according to claim 9, wherein the control unit (UC) is configured to compute the internal offset $\Delta_{CONV\_k}$ of the converter of rank $k$ ($k=1, \ldots, N-1$), by the following relationship, starting from $k=N-1$:

$$\Delta_{CONV\_k} = \tfrac{1}{2} * \text{lat}_{CONV\_k->CONV\_k+1} + \Delta_{CONV\_k+1}$$

in which $\text{lat}_{CONV\_k->CONV\_k+1}$ corresponds to the latency between the converter of rank k and the converter of rank k+1,
and in which $\Delta CONV\_N = 0$.

* * * * *